United States Patent [19]

Iwasaki et al.

[11] Patent Number: 4,657,942
[45] Date of Patent: Apr. 14, 1987

[54] PHOTOPOLYMERIZABLE COMPOSITION

[75] Inventors: Masayuki Iwasaki; Minoru Maeda; Sadao Fujikura, all of Shizuoka, Japan

[73] Assignee: Fuji Photo Film Co., Ltd., Japan

[21] Appl. No.: 822,499

[22] Filed: Jan. 27, 1986

[30] Foreign Application Priority Data

Jan. 25, 1985 [JP] Japan .................................. 60-12275

[51] Int. Cl.⁴ .............................. C08F 2/50; C08J 3/28
[52] U.S. Cl. ....................................... 522/16; 522/26; 522/51; 522/121; 430/286; 430/920; 430/922; 430/926; 548/142
[58] Field of Search .............................. 522/16, 26, 51; 430/920, 922, 926, 286

[56] References Cited

U.S. PATENT DOCUMENTS

| | | | |
|---|---|---|---|
| 4,040,922 | 8/1977 | Wang | 430/920 |
| 4,141,807 | 2/1979 | Via | 522/16 |
| 4,204,928 | 5/1980 | Via | 522/16 |
| 4,212,970 | 7/1980 | Iwasaki | 522/26 |
| 4,543,318 | 9/1985 | Maeda | 548/142 |

Primary Examiner—John C. Bleutge
Assistant Examiner—A. H. Koeckert
Attorney, Agent, or Firm—Sughrue, Mion, Zinn, Macpeak and Seas

[57] ABSTRACT

A photopolymerizable composition is described, comprising an addition polymerizable compound having at least two ethylenically unsaturated bonds in the molecule, at least one photopolymerization initiator, and at least one of 2-mercapto-5-substituted thiadiazole compounds represented by formulae (I) and (II)

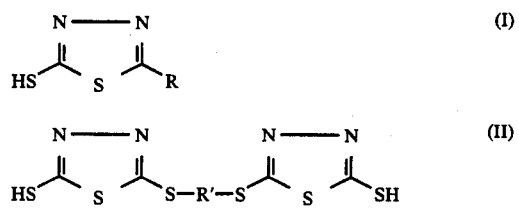

wherein R represents a substituted or unsubstituted alkyl group, a substituted or unsubstituted aralkyl group, a substituted or unsubstituted alkylthio group, or a substituted or unsubstituted aralkylthio group; and R' represents a substituted or unsubstituted alkylene group. The composition has a remarkably good photosensitivity.

17 Claims, No Drawings

PHOTOPOLYMERIZABLE COMPOSITION

FIELD OF THE INVENTION

This invention relates to a photopolymerizable composition containing a novel heterocyclic thiol compound, and, more particularly, to a highly sensitive photopolymerizable composition suited for lithographic printing plates, resin letterpress, resists for the production of printed circuit boards, photomasks, etc.

BACKGROUND OF THE INVENTION

Photopolymerizable compositions generally comprise an addition polymerizable compound having at least two ethylenically unsaturated bonds in the molecule (hereinafter referred to as "polyfunctional monomer") and a photopolymerization initiator, and are insolubilized in solvents by curing upon irradiation with light. Taking advantage of this property, they have been widely used in the fields of photography, printing, metal surface finishing, inks, and the like. Descriptions thereof appear in J. Kosar, *Light Sensitive Systems*, pp. 158–193, J. Wiley & Sons (New York, 1965).

Intensive studies have hitherto been made in an attempt to increase light sensitivity of the photopolymerizable compositions. For example, various photopolymerization initiators have been proposed, such as benzoin ethers as described in U.S. Pat. No. 2,448,828, benzoins as described in U.S. Pat. No. 2,722,512, anthraquinones as described in U.S. Pat. No. 3,046,127, combinations of aminophenyl ketones and active methyl compounds or amino compounds as described in Japanese Patent Publication No. 11936/74, combinations of Michler's ketone and benzophenone as described in U.S. Pat. No. 3,682,641, etc. Although these conventional photopolymerization initiators realize improvement of light sensitivity, they are still unsatisfactory in practical use. In particular, when they are used in a light-sensitive layer of a light-sensitive element, such as a light-sensitive dry film resist for producing light-sensitive lithographic printing plates or printed circuit boards, a print-out function is imparted to a light-sensitive layer in order to clearly distinguish between exposed areas and unexposed areas immediately upon exposure to light. To this effect, a leucotriphenylmethane compound or a dye whose color disappears under acidic conditions is usually added to a light-sensitive composition. However, resist-forming sensitivity is frequently inhibited by such additives. Further, a heat polymerization inhibitor is added for the purpose of ensuring heat stability of the light-sensitive layer, but this also causes reduction in sensitivity for resist formation. Accordingly, it has been demanded to develop a photopolymerization initiator that provides a highly sensitive photopolymerizable composition.

It is taught in U.S. Pat. No. 2,773,822 that thiol compounds are effective as photopolymerization initiators. It is also known to use thiol compounds in combination with other photopolymerization initiators to enhance sensitivity. For example, U.S. Pat. No. 3,479,185 describes that sensitivity can be increased by using 4-acetamidothiophenol, 2-mercaptobenzimidazole, 2-mercaptobenzoxazole, 2-mercaptobenzothiazole, or 2-mercaptosuccinic acid in combination with a lophine dimer. Japanese Patent Application (OPI) No. 702/78 (the term "OPI" herein used means "published unexamined application", hereinafter the same) describes that mercaptoimidazoline, etc., is effective not only to accelerate adhesion of a resist to a copper base but also to increase sensitivity. Further, Japanese Patent Application (OPI) No. 56403/84 discloses a combination of a p-dialkylaminostilbene derivative, a lophine dimer and mercaptobenzoxazole. According to the above-cited patents and applications, the effect of these mercapto compounds to increase sensitivity is attributed to prevention of oxygen from inhibition during exposure and polymerization.

Addition of the above-described known compounds to photopolymerizable compositions surely brings about an increase in sensitivity, but such increased sensitivity is only about twice the sensitivity obtained in the absence of these compounds at the most and is still unsatisfactory in level.

SUMMARY OF THE INVENTION

An object of this invention is to provide at least one photopolymerization initiator which provides a highly sensitive photopolymerizable composition.

As a result of extensive investigations, it has now been found that a photopolymerizable composition having very high sensitivity can be obtained by using a specific heterocyclic thiol compound in combination with a known photopolymerization initiator. The present invention has been completed based on this finding.

That is, the above object can be accomplished by a photopolymerizable composition comprising an addition polymerizable compound having at least two ethylenically unsaturated bonds in the molecule (polyfunctional monomer), at least one photopolymerization initiator, and at least one of 2-mercapto-5-substituted thiadiazole compounds represented by formulae (I) and (II)

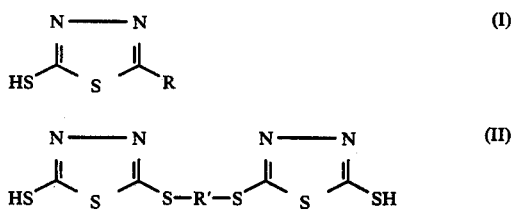

wherein R represents a substituted or unsubstituted alkyl group, a substituted or unsubstituted aralkyl group, a substituted or unsubstituted alkylthio group, or a substituted or unsubstituted aralkylthio group; and R' represents a substituted or unsubstituted alkylene group.

DETAILED DESCRIPTION OF THE INVENTION

Preferably, R represents an unsubstituted, hydroxyl-substituted, or dialkylamino-substituted alkyl group having from 1 to 12 carbon atoms, aralkyl group having from 7 to 18 carbon atoms, alkylthio group having from 1 to 12 carbon atoms, or aralkylthio group having from 7 to 18 carbon atoms.

Specific examples of the compounds represented by formulae (I) and (II) are set forth below, which, however, do not whatsoever restrict the scope of formulae (I) and (II).

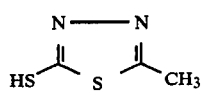 No. 1
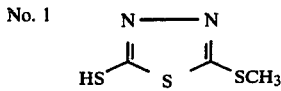 No. 2
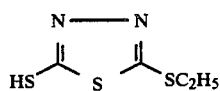 No. 3
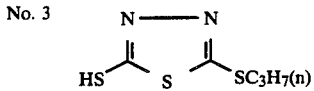 No. 4
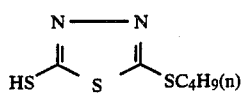 No. 5
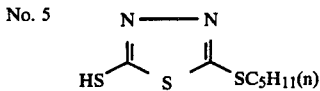 No. 6
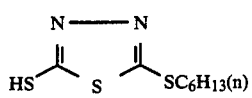 No. 7
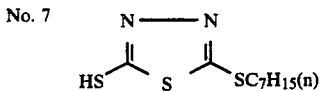 No. 8
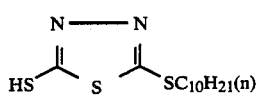 No. 9
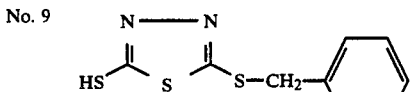 No. 10
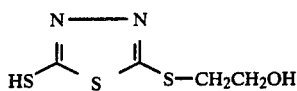 No. 11
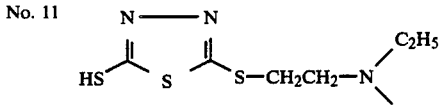 No. 12
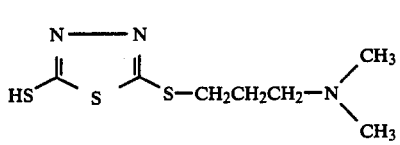 No. 13
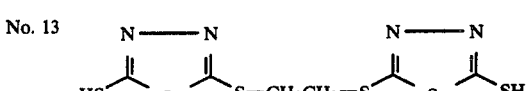 No. 14
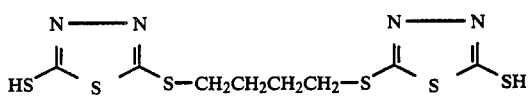 No. 15
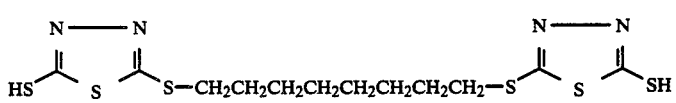 No. 16

Examples of the polyfunctinal monomers which can be used in the photopolymerizable composition of the present invention include acrylic acid or methacrylic acid esters of polyols as described in Japanese Patent Publication Nos. 5093/60, 14719/60, and 28727/69, e.g., diethylene glycol di(meth)acrylate, triethylene glycol di(meth)acrylate, tetraethylene glycol di(meth)acrylate, nonaethylene glycol di(meth)acrylate, pentaerythritol tri(meth)acrylate, trimethylolpropane tri(meth)acrylate, dipentaerythritol hexa(meth)acrylate, 1,6-hexanediol di(meth)acrylate, etc.; bis(meth)acrylamide, e.g., methylenebis(meth)acrylamide, ethylenebis(meth)acrylamide, etc.; polyfunctional monomers having a urethane group, e.g., di(2-methacryloxyethyl)-2,4-tolylenediurethane, di(2-acryloxyethyl)hexamethylenediurethane, etc.; and (meth)acrylurethane oligomers which are obtained by reacting a polyol with a diisocyanate and reacting the resulting isocyanateterminated compound with a β-hydroxyalkyl (meth)acrylate.

The photopolymerization initiator which can preferably be used in the present invention includes the compounds represented by the following formulae (IIIa) to (IIIe) and combinations of two or more thereof.

Formula (IIIa) is represented by

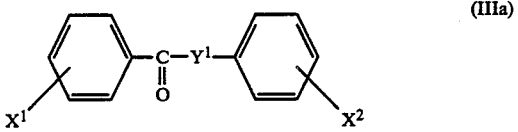 (IIIa)

wherein $X^1$ and $X^2$ (which may be the same or different) each represents a hydrogen atom, an alkyl group having from 1 to 6 carbon atoms, an alkoxycarboxyl group having from 1 to 6 carbon atoms, an alkoxycarbonyl group having from 1 to 6 carbon atoms, an alkyldisubstituted amino group having from 1 to 6 carbon atoms, or a halogen atom; $Y^1$ represents a single chemical bond or $$-\underset{\underset{OR^2}{|}}{\overset{\overset{R^1}{|}}{C}}-,$$

wherein $R^1$ represents a hydrogen atom or $OR^2$; and $R^2$ represents a hydrogen atom or an alkyl group having from 1 to 6 carbon atoms.

Formula (IIIb) is represented by

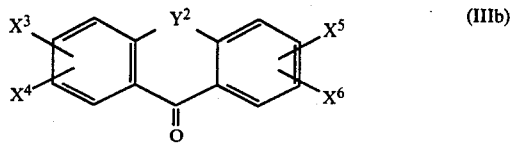

wherein $X^3$, $X^4$, $X^5$, and $X^6$ (which may be the same or different) each represents a hydrogen atom, an alkyl group having from 1 to 6 carbon atoms, an alkoxy group having from 1 to 6 carbon atoms, a carboxyl group, an alkoxycarbonyl group having from 1 to 6 carbon atoms, an aryloxycarbonyl group having from 6 to 12 carbon atoms or a halogen atom; $Y^2$ represents a single chemical bond, an oxygen atom, a sulfur atom, an amino group, an amino group substituted with an alkyl group having from 1 to 6 carbon atoms or a carbonyl group.

Formula (IIIc) is represented by

wherein $R^3$ represents an alkyl group having from 1 to 6 carbon atoms, an alkoxy group having from 1 to 6 carbon atoms, a cyano group, a halogen atom, a phenyl group, a phenyl group substituted with a methylenedioxy group, a naphthyl group, a styryl group, or a styrylphenyl group; and Z represents a halogen atom.

Formula (IIId) is represented by

wherein $R^4$ and Z have the same meanings as defined for $R^3$ and Z in formula (IIIc), respectively.

Formula (IIIe) is represented by

wherein $R^5$ represents an alkyl group having from 1 to 6 carbon atoms, an alkoxy group having from 1 to 6 carbon atoms, a halogen atom, a phenyl group, a phenyl group substituted with a cyano group, or a naphthyl group; and Z is as defined above.

Specific examples of the compounds represented by formula (IIIa) include benzophenone, 4-chlorobenzophenone, 2,4-dichlorobenzophenone, 2-ethoxy-carbonylbenzophenone, benzophenone-2-carboxylic acid, 4-methylbenzophenone, 4,4'-dimethoxybenzophenone, 4,4'-bis(dimethylamino)benzophenone, 4,4'-bis(diethylamino)benzophenone, 4-dimethylaminobenzophenone, 4-dimethylaminoacetophenone, benzoin, benzoin methyl ether, benzoin ethyl ether, benzoin isopropyl ether, benzoin propyl ether, benzoin phenyl ether, benzyl dimethyl ketal, 3,3'-dimethoxybenzoin, and the like.

Specific examples of the compounds represented by formula (IIIb) include fluorenone, xanthone, thioxanthone, 2-chlorothioxanthone, 2,4-dichlorothioxanthone, 2-iso-propylthioxanthone, 2,4-dimethylthioxanthone, 2,4-diethyl-thioxanthone, 2,4-diisopropylthioxanthone, 2-methyl-6-ethoxycarbonylthioxanthone, anthraquinone, 2-t-butyl-anthraquinone, 2-methylanthraquinone, 2-chloroanthra-quinone, acridone, N-ethylacridone, and the like.

Specific examples of the compounds represented by formula (IIIc) include 2-trichloromethyl-5-phenyl-1,3,4-oxadiazole, 2-trichloromethyl-5-(4-chloropheynyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadizole, 2-trichloromethyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole, and the like.

Specific examples of the compounds represented by formula (IIId) include 2,4,6-tris(trichloromethyl)-s-triazine, 2-phenyl-4,6-bis(trichloromethyl)-s-triazine, 2-(4-methoxyphenyl)-4,6-bis(trichloromethyl)-s-triazine, 2-(4-chlorophenyl)4,6-bis(tribromomethyl)-s-triazine, 2,4-bis(trichloromethyl)-6-(4-methoxystyryl)-1,3,4-s-triazine, and the like.

Specific examples of the compounds represented by formula (IIIe) include phyenyltribromomethylsulfone, p-nitrophenyltribromomethylsulfone, p-chlorophenyltribromomethylsulfone, and the like.

The photopolymerizable composition in accordance with the present invention essentially comprises the above-described mercaptothiadiazole compound, photopolymerization initiator or initiators and polyfunctional monomers. If desired, the photopolymerizable composition may further contain various additives, such as high polymeric binders, heat polymerization inhibitors, plasticizers, dyes, color changing agents, monofunctional ethylenically unsaturated compounds, agents for accelerating adhesion to the surface of an anodically oxidized aluminum plate or a copper. Performance characteristics of the photopolymerizable composition can be controlled so as to meet the requirements of a particular intended end use, such as lithographic printing plates, resin letterpress, photoresists, photomasks, and the like.

The polymeric binders are to be used for the purpose of improving printability or physical properties of resists. Examples of such binders include saturated or unsaturated and modified or unmodified alkyd or polyester resins, vinyl resins, acrylic resins, epoxy resins, xylene resins, aromatic sulfonamide formaldehyde resins, ketone resins, petroleum resins, diallyl phthalate resins, melamine resins, rosin-modified phenol resins, natural resins, e.g., cellulose and cellulose derivatives, and the like. Particularly preferred binders are alcohol-soluble nylon, polymethyl methacrylate, and a methyl methacrylatemethacrylic acid copolymer.

The heat polymerization inhibitor is added to prevent the photopolymerizable composition from heat polymerization or polymerization with passage of time. Examples of the heat polymerization inhibitor which can be used include p-methoxyphenol, hydroquinone, t-butyl catechol, pyrogallol, 2-hydroxybenzophenone, 4-methoxy-2-hydroxybenzophenone, cuprous chloride, phenothiazone, chloranil, naphthylamine, β-naphthol, 2,6-di-t-butylcresol, nitrobenzene, dinitrobenzene, picric acid, p-toluidine, etc.

The plasticizer is added to control film properties. Examples of the plasticizer include phthalic esters, e.g., dibutyl phthalate, diheptyl phthalate, dioctyl phthalate, diallyl phthalate, etc.; glycol esters, e.g., triethylene glycol diacetate, tetraethylene glycol diacetate, etc.; phosphoric esters, e.g., tricresyl phosphate, triphenyl phosphate, etc.; amides, e.g., p-toluenesulfonamide, benzenesulfonamide, N-n-butylacetamide, etc.; aliphatic dibasic acid esters, e.g., diisobutyl adipate, dioctyl adipate, dimethyl sebacate, dioctyl azelate, dibutyl maleate, etc.; triethyl citrate, tributyl citrate, glycerin triacetyl ester, butyl laurate, dioctyl 4,5-diepoxycyclohexane-1,2-dicarboxylate, etc.

Examples of useful dyes include Brilliant Green, Eosine, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Metanil Yellow, Thymolsulfophthalein, Xylenol Blue, Methyl Orange, Orange IV, diphenyl tiocarbazone, 2,7-dichlorofluorescein, Paramethyl Red, Congo Red, Benzopurpurine 4B, α-Naphthyl Red, Nile Blue A, Phenacetolin, Methyl Violet, Malachite Green, Parafuchsin, Oil Blue #603 (produced by Orient Chemical Co., Ltd.), Rhodamine B, Rhodamine 6G, etc.

The color changing agent is added to the photopolymerizable composition so as to provide a visible image upon exposure to light. Examples of the color changing agent to be used include the above-described dyes, and, in addition, diphenylamine, dibenzylaniline, triphenylamine, diethylaniline, diphenyl-p-phenylene-diamine, p-toluidine, 4,4'-biphenyldiamine, o-chloroaniline, p,p',p''-hexamethyltriaminotriphenylmethane, p,p'-tetramethyldiaminotriphenylmethane, p,p',p''-triaminotriphenylcarbinol, and the like.

Specific examples of the monofunctional ethylenically unsaturated compound which can be used include ethylene glycol mono(meth)acrylate, triethylene glycol methyl ether (meth)acrylate, ethylene glycol phenyl ether (meth)acrylate, tetraethylene glycol mono(meth)acrylate, diacetonacrylamide, (meth)acrylamide, N-n-butyl(meth)acrylamide, and the like.

Specific examples of the adhesion acclerator include the compounds disclosed in Japanese Patent Publication No. 9177/75, e.g., benzimidazole, benzothiazole, benzoxazole, benzotriazole, etc., and the compounds disclosed in Japanese Patent Application (OPI) No. 702/78, e.g., 2-mercaptobenzothiazole, 2-mercaptobenzimidazole, etc.

Preferred and more preferred proportions of the above-described components in the photopolymerizable composition according to the present invention are tabulated below, in which the unit is part by weight per 100 parts by weight of the polyfunctional monomer.

| Component | Preferred Range | More Preferred Range |
| --- | --- | --- |
| Photopolymerization initiator | 0.1–100 | 1–50 |
| Compound of formulae (I) and/or (II) | 0.01–100 | 0.1–50 |
| Polymeric binder | 0–10,000 | 0–1,000 |
| Heat polymerization inhibitor | 0–50 | 0–20 |
| Plasticizer | 0–1,000 | 0–100 |
| Dye | 0–100 | 0–50 |
| Color changing agent | 0–100 | 0–50 |
| Monofunctional ethylenically unsaturated compound | 0–1,000 | 0–100 |
| Adhesion accelerator | 0–50 | 0–20 |

The photopolymerization composition according to the present invention can be prepared by dissolving the above-described components in an appropriate solvent, and the composition is coated on a desired support by a known coating technique. The solvents to be used include ethylene dichloride, monochlorobenzene, cyclohexanone, methyl ethyl ketone, acetone, methyl cellosolve acetate, ethyl acetate, methyl acetate, methyl cellosolve, toluene, xylene, etc., and mixtures thereof.

The photopolymerizable composition of the present invention is suitable as a photoresist layer of dry film resists. In this case, the photoresist layer usually has a thickness of from 0.1 to 500 μm, and preferably from 1 to 200 μm. For the production of light-sensitive lithographic printing plates using the photopolymerizable composition of this invention as a light-sensitive layer, the photopolymerizable composition is usually coated to a dry coverage of from 0.1 to 10.0 g/m$^2$, and preferably from 0.5 to 5.0 g/m$^2$.

In the production of dry film resists, supports which can be used generally have a thickness of from 3 to 100 μm and include polyamide film,s polyolefin films, polyester films, vinyl polymer films, cellulose ester films, etc. A particularly preferred support is a transparent polyethylene terephthalate film having a thickness of about 25 μm. As a protective film, polyolefins are suitably employed. In particular, a polyethylene film of from 20 to 25 μm in thickness is preferred.

In the production of photomasks from the photopolymerizable composition of this invention, suitable supports to be employed include an aluminum-, aluminum alloy-, or chrome-vapor deposited polyethylene terephthalate film and a polyethylene terephthalate film having provided thereon a colored layer.

In the production of light-sensitive lithographic printing plates using the photopolymerizable composition of the present invention as a light-sensitive layer, supports to be used suitably include aluminum plates having been rendered hydrophilic, such as a silicate-treated aluminum plate, an anodically oxidized aluminum plate, a grained aluminum plate, a silicate-electro-deposited aluminum plate, etc., a zinc plate, a stainless steel plate, a chrominum-treated copper plate, a plastic film having been rendered hydrophilic and a sheet of paper.

Further, when the photopolymerizable composition of the present invention is applied to the production of proofs for multicolor printing, films for overhead projectors or films for a second original, examples of suitable supports to be used include transparent films, e.g., a polyethylene terephthalate film, a cellulose triacetate film, etc., and these plastic films having their surface chemically or physically matted.

The photopolymerizable composition in accordance with the present invention can be developed with an organic solvent or a weakly alkaline aqueous solution selected according to the kind of binders. A weakly alkaline aqueous solution containing a small amount, e.g., about 20% by weight or less, of a water-miscible organic solvent may also be used.

Examples of the organic solvent which can be used as a developing solution include 1,1,1-trichloroethane, 1,2-dichloroethane, tetrachloroethylene, methyl ethyl ketone, dimethylformamide, dimethyl sulfoxide, ethylene glycol monobutyl ether, and the like, with 1,1,1-trichloroethane being particularly preferred. Bases to be added suitable include hydroxides, carbonates, bicarbonates, silicates, phosphates, pyrophosphates, and acetates of alkali metals, ammonium or quaternary ammonium, and amines, e.g., lithium hydroxide, sodium hydroxide, potassium hydroxide, ammonium hydroxide, trimethylbenzylammonium hydroxide, sodium carbonate, potassium carbonate, sodium hydrogencarbonate, potassium hydrogencarbonate, sodium silicate, sodium phosphate, potassium phosphate, sodium pyrophosphate, sodium acetate, diethanolamine, triethanolamine, and the like, with a 1 or 2 wt% aqueous solution of sodium carbonate being particularly preferred.

The photopolymerizable composition of the present invention exhibits remarkably high light-sensitivity. It is also surprising that the photopolymerizable composition is excellent in flexibility and adhesion to a base in film forming and that the formed resists has high reproducibility of an original image with high resolving power and is easy to peel off. As a result, the present invention makes it possible to finish the base with high accuracy.

In addition, the photopolymerizable composition of the present invention, when used as a material of light-sensitive dry film resists, has excellent resistance to cold flow and provides photoresists whose surfaces are free from tackiness. Also, due to superior adhesion to a base, the resist retains its properties as a resist against etching with general etching solutions, e.g., a ferric chloride aqueous solution, an ammonium persulfate aqueous solution, etc., or general plating with, e.g., solder, copper pyrophosphate, copper sulfate, etc.

The present invention will now be illustrated in greater detail with reference to the following examples and comparative examples, but it should be understood that the present invention is not limited thereto.

EXAMPLES 1 TO 7 AND COMPARATIVE EXAMPLES 1 TO 7

A light-sensitive composition having the following formulation was bar-coated on a 25 μm thick polyethylene terephthalate temporary support and dried in an oven at 100° C. for 5 minutes to obtain a light-sensitive film having a thickness of 50 μm.

| Formulation of Light-Sensitive Composition: | |
|---|---|
| Benzyl acrylate/methyl acrylate/methacrylic acid/acrylic acid radical copolymer (50/10/20/20 by mol %; weight average molecular weight = 120,000) | 15 g |
| Trimethylolpropane triacrylate | 4.0 g |
| Nonaethylene glycol diacrylate | 4.0 g |
| Photopolymerization initiator(s) | see Table 1 |
| 2-Mercapto-5-methylthio-1,3,4-thiadiazole | 0.08 g |
| 1-Phenyl-3-morpholinomethyl-1,3,4-triazole-2-thione | 0.09 g |
| Leuco Methyl Violet | 0.1 g |
| Victoria Pure Blue BOH | 0.01 g |
| p-Methoxyphenol | 0.01 g |
| Methyl ethyl ketone | 5.6 g |
| 2-Methoxyethanol | 16.9 g |

The resulting light-sensitive film was laminated on a copper-clad epoxy-glass laminate having a thickness of 36 μm in by means of a hot roller in such a manner that the light-sensitive layer contacted the copper surface. A step wedge having an optical density difference of 0.15 (Fuji PS Plate Step Guide, produced by Fuji Photo Film Co., Ltd.) was superposed thereon, and the light-sensitive material was exposed to light radiated with a 2 Kw ultra-high pressure mercury lamp (Jet Light, produced by Oak Co., Ltd.) to an exposure of 80 mJ/cm$^2$. After allowing the laminate to stand for 15 minutes, the polyethylene terephthalate temporary support was stripped off.

The laminate ws washed with a 1 wt% sodium carbonate aqueous solution at 40° C. by spraying to remove the unexposed areas. The number of the step of the step wedge which had been cleared was taken as sensitivity. The higher the step, the higher the sensitivity.

Separately, the same procedures as described above were repeated except that the light-sensitive composition did not contain 2-mercapto-5-methylthio-1,3,4-thiadiazole, and the sensitivity of the resulting light-sensitive film was determined (Comparative Examples 1 to 7).

The results obtained are shown in Table 1 below. It can be seen from these results that the light-sensitivity of the light-sensitive composition containing any photopolymerization initiator or initiators can be increased 2.83 to 5.66 times by incorporating the compound of the present invention.

TABLE 1

| Example No. | Photopolymerization Initiator(s) | Amount (g) | Compound of Invention | Sensitivity |
|---|---|---|---|---|
| Example 1 | 5-(4-n-butoxystyryl)-2-trichloromethyl-1,3,4-oxadiazole | 0.5 | added | 9 |
| Comparative Example 1 | 5-(4-n-butoxystyryl)-2-trichloromethyl-1,3,4-oxadiazole | 0.5 | not added | 6 |
| Example 2 | α,α-dimethoxy-α-phenylacetophenone | 0.5 | added | 10 |
| Comparative Example 2 | " | 0.5 | not added | 7 |
| Example 3 | 2,4-dimethylthioxanthone ethyl 4-N,N—dimethylbenzoate | 0.2 0.34 | added | 16 |
| Comparative Example 3 | 2,4-dimethylthioxanthone ethyl 4-N,N—dimethylbenzoate | 0.2 0.34 | not added | 13 |
| Example 4 | 4,4'-bis(N,N—diethylamino)benzophenone benzophenone | 0.04 0.24 | added | 10 |
| Comparative Example 4 | 4,4'-bis(N,N—diethylamino)benzophenone benzophenone | 0.04 0.24 | not added | 7 |
| Example 5 | Michler's ketone 2-(2-chlorophenyl)-4,5-diphenylimidazolyl | 0.04 0.8 | added | 16 |

TABLE 1-continued

| Example No. | Photopolymerization Initiator(s) | Amount (g) | Compound of Invention | Sensitivity |
|---|---|---|---|---|
| Comparative Example 5 | Michler's ketone | 0.04 | not added | 11 |
|  | 2-(2-chlorophenyl)-4,5-diphenylimidazolyl dimer | 0.8 |  |  |
| Example 6 | 4,4'-bis(N,N—diethylamino)benzophenone | 0.04 | added | 11 |
|  | benzophenone | 0.24 |  |  |
|  | phenyltribromomethylsulfone | 0.4 |  |  |
| Comparative Example 6 | 4,4'-bis(N,N—diethylamino)benzophenone | 0.04 | not added | 8 |
|  | benzophenone | 0.24 |  |  |
|  | phenyltribromomethylsulfone | 0.4 |  |  |
| Example 7 | Michler's ketone | 0.04 | added | 16 |
|  | benzophenone | 0.24 |  |  |
|  | 2-(2-chlorophenyl)-4,5-diphenylimidazolyl dimer | 0.4 |  |  |
| Comparative | Michler's ketone | 0.04 | not added | 11 |
|  | benzophenone | 0.24 |  |  |
|  | 2-(2-chlorophenyl)-4,5-diphenylimidazolyl dimer | 0.4 |  |  |

EXAMPLES 8 TO 10 AND COMPARATIVE EXAMPLES 8 TO 12

The same procedures as described in Example 7 were repeated but using the mercapto compound shown in Table 2 below in place of 2-mercapto-5-methylthio-1,3,4-thiadiazole. The results obtained are also shown in Table 2.

TABLE 2

| Example No. | Mercapto Compound | Amount (g) | Sensitivity |
|---|---|---|---|
| Example |  |  |  |
| 8 | 2-mercapto-5-methyl-1,3,4-thiadiazole | 0.08 | 16 |
| 9 | 2-mercapto-5-n-hexylthio-1,3,4-thiadiazole | 0.10 | 17 |
| 10 | 2-mercapto-5-benzylthio-1,3,4-thiadiazole | 0.12 | 16 |
| Comparative Example |  |  |  |
| 8 | 2-mercaptobenzoxazole | 0.08 | 13 |
| 9 | 2-mercaptobenzothiazole | 0.09 | 12 |
| 10 | 2-mercaptobenzimidazole | 0.08 | 12 |
| 11 | 2-mercaptoimidazoline | 0.08 | 12 |
| 12 | 5-amino-1,3,4-thiadiazole-2-thiol | 0.10 | 12 |

It is apparent from Table 2 above that use of the mercapto compounds according to the present invention brings about greatly increased sensitivity over use of the conventionally known mercapto compounds.

EXAMPLES 11 AND 12 AND COMPARATIVE EXAMPLE 13

A light-sensitive film was obtained in the same manner as described in Example 1 but using the following light-sensitive composition. Sensitivities of the resulting films are shown in Table 3.

| Formulation of Light-Sensitive Composition: |  |
|---|---|
| Benzyl methacrylate/methyl acrylate/methacrylic acid/acrylic acid radical copolymer (50/10/20/20 by mole %; weight average molecular weight = 90,000) | 15 g |
| Trimethylolpropane triacrylate | 3.2 g |
| Nonaethylene glycol diacrylate | 3.2 g |
| 2,4-Diethylthioxanthone | 0.2 g |
| Ethyl 4-N,N—dimethylaminobenzoate | 0.3 g |
| 2-Mercapto-5-methylthio-1,3,4- | see Table 3 |

-continued

| Formulation of Light-Sensitive Composition: |  |
|---|---|
| thiadiazole |  |
| 1-Phenyl-3-morpholinomethyl-1,3,4-triazole-2-thione | 0.09 g |
| Leuco Crystal Violet | 0.1 g |
| Victoria Pure Blue BOH | 0.01 g |
| p-Methoxyphenol | 0.01 g |
| Methyl ethyl ketone | 5.6 g |
| 1-Methoxy-2-propanol | 16.9 g |

TABLE 3

| Example No. | Amount of Mercapto Compound (g) | Sensitivity |
|---|---|---|
| Example 11 | 0.05 | 15 |
| Example 12 | 0.09 | 16 |
| Comparative Example 13 | 0 | 12 |

The results of Table 3 prove that incorporation of the mercapto compound according to the present invention to light-sensitive compositions increases sensitivity 2.83 to 4.00 times.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising an addition polymerizable compound having at least two ethylenically unsaturated bonds in the molecule, at least one photopolymerization initiator and at least one of 2-mercapto-5-substituted thiadiazole compounds represented by formulae (I) and (II)

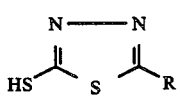  (I)

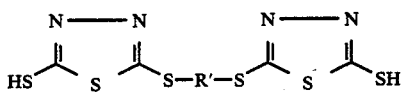  (II)

wherein R represents a substituted or unsubstituted alkyl group, a substituted or unsubstituted aralkyl group, a substituted or unsubstituted alkylthio group, or a substituted or unsubstituted aralkylthio group; and R' represents a substituted or unsubstituted alkylene group.

2. A photopolymerizable composition as in claim 1, wherein said photopolymerization initiator is selected from compounds represented by formula (IIIa)

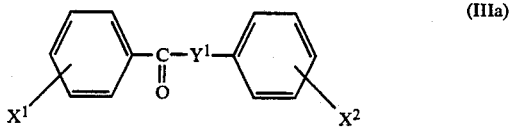
(IIIa)

wherein $X^1$ and $X^2$ each represents a hydrogen atom, an alkyl group having from 1 to 6 carbon atoms, an alkoxycarboxyl group having from 1 to 6 carbon atoms, an alkoxycarbonyl group having from 1 to 6 carbon atoms, an alkyldisubstituted amino group having from 1 to 6 carbon atoms, or a halogen atom; and $Y^1$ represents a single chemical bond or

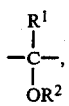

wherein $R^1$ represents a hydrogen atom or $OR^2$; and $R^2$ represents a hydrogen atom or an alkyl group having from 1 to 6 carbon atoms; compounds respresented by formula (IIIb)

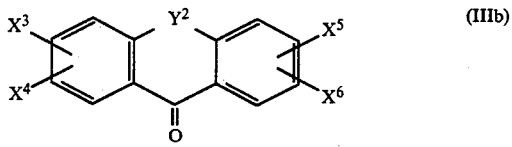
(IIIb)

wherein $X^3$, $X^4$, $X^5$, and $X^6$ each represents a hydrogen atom, an alkyl group having from 1 to 6 carbon atoms, an alkoxy group having from 1 to 6 carbon atoms, a carboxyl group, an alkoxycarbonyl group having from 1 to 6 carbon atoms, an aryloxycarbonyl group having from 6 to 12 carbon atoms, or a halogen atom; $Y^2$ represents a single chemical bond, an oxygen atom, a sulfur atom, an amino group, an amino group substituted with an alkyl group having from 1 to 6 carbon atoms or a carbonyl group; compounds represented by formula (IIIc)

(IIIc)

wherein $R^3$ represents an alkyl group having from 1 to 6 carbon atoms, an alkoxy group having from 1 to 6 carbon atoms, a cyano group, a halogen atom, a phenyl group, a phenyl group substituted with a methylenedioxy group, a naphthyl group, a styryl group, or a styrylphenyl group; and Z represents a halogen atom; compounds represented by formula (IIId)

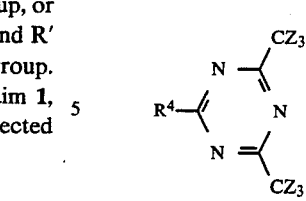
(IIId)

wherein $R^4$ and Z have the same meanings as defined for $R^3$ and Z in formula (IIIc), respectively; and compounds represented by formula (IIIe)

(IIIe)

wherein $R^5$ represents an alkyl group having from 1 to 6 carbon atoms, an alkoxy group having from 1 to 6 carbon atoms, a halogen atom, a phenyl group, a phenyl group substituted with a cyano group, or a naphthyl group; and Z is as defined above.

3. A photopolymerizable composition as in claim 1, wherein said polymerization initiator is present in a total amount of from 0.1 to 100 parts by weight per 100 parts by weight of addition polymerizable compound.

4. A photopolymerizable composition as in claim 3, wherein said polymerization initiator is present in a total amount of from 1 to 50 parts by weight per 100 parts by weight of addition polymerizable compound.

5. A photopolymerizable composition as in claim 1, wherein said 2-mercapto-5-substituted thiadiazole compound is present in a total amount of from 0.01 to 100 parts by weight per 100 parts by weight of addition polymerizable compound.

6. A photopolymerizable composition as in claim 5, wherein said 2-mercapto-5-substituted thiadiazole compound is present in a total amount of from 0.1 to 50 parts by weight per 100 parts by weight of addition polymerizable compound.

7. A photopolymerizable composition as in claim 2, wherein said polymerization initiator is present in a total amount of from 0.1 to 100 parts by weight per 100 parts by weight of addition polymerizable compound.

8. A photopolymerizable composition as in claim 7, wherein said polymerization initiator is present in a total amount of from 1 to 50 parts by weight per 100 parts by weight of addition polymerizable compound.

9. A photopolymerizable composition as in claim 2, wherein said 2-mercapto-5-substituted thiadiazole compound is present in a total amount of from 0.01 to 100 parts by weight per 100 parts by weight of addition polymerizable compound.

10. A photopolymerizable composition as in claim 9, wherein said 2-mercapto-5-substituted thiadiazole compound is present in a total amount of from 0.1 to 50 parts by weight per 100 parts by weight of addition polymerizable compound.

11. A photopolymerizable composition as in claim 3, wherein said 2-mercapto-5-substituted thiadiazole compound is present in a total amount of from 0.01 to 100 parts by weight per 100 parts by weight of addition polymerizable compound.

12. A photopolymerizable composition as in claim 4, wherein said 2-mercapto-5-substituted thiadiazole compound is present in a total amount of from 0.1 to 50 parts by weight per 100 parts by weight of addition polymerizable compound.

13. A photopolymerizable composition as in claim 1, wherein said composition further comprises one or more members selected from the group consisting of a polymeric binder, a heat polymerization inhibitor, a plasticizer, a dye, a color changing agent, a monofunctional ethylenically unsaturated compound, and an adhesion accelerator.

14. A photopolymerizable composition as in claim 11, wherein said composition further comprises one or more members selected from the group consisting of a polymeric binder in an amount up to 10,000 parts by weight, a heat polymerization inhibitor in an amount up to 50 parts by weight, a plasticizer in an amount up to 1,000 parts by weight, a dye in an amount up to 100 parts by weight, a color changing agent in an amount up to 100 parts by weight, a monofunctional ethylenically unsaturated compound in an amount up to 1,000 parts by weight, and an adhesion accelerator in an amount up to 50 parts by weight, per 100 parts by weight of addition polymerizable compound.

15. A photopolymerizable composition as in claim 12, wherein said composition further comprises one or more members selected from the group consisting of a polymeric binder in an amount up to 1,000 parts by weight, a heat polymerization inhibitor in an amount up to 20 parts by weight, a plasticizer in an amount up to 100 parts by weight, a dye in an amount up to 50 parts by weight, a color changing agent in an amount up to 100 parts by weight, a monofunctional ethylenically unsaturated compound in an amount up to 100 parts by weight, and an adhesion accelerator in an amount up to 20 parts by weight, per 100 parts by weight of addition polymerizable compound.

16. A photopolymerizable composition as in claim 1, wherein R represents an alkyl group substituted with a hydroxyl group or a dialkylamino group, an aralkyl group substituted with a hydroxyl group or a dialkylamino group, an alkylthio group substituted with a hydroxyl group or a dialkylamino gorup, or an aralkylthio group substituted with a hydroxyl group or a dialkylamino group.

17. A photopolymerizable composition as in claim 1, wherein R represents an alkyl group having from 1 to 12 carbon atoms, an aralkyl group having from 7 to 18 carbon atoms, an alkylthio group having from 1 to 12 carbon atoms, or an aralkylthio group having from 7 to 18 carbon atoms.

* * * * *